United States Patent [19]

Rokos

[11] Patent Number: 4,958,209
[45] Date of Patent: Sep. 18, 1990

[54] VARICAP DIODE STRUCTURE

[75] Inventor: George H. S. Rokos, Herts, Great Britain

[73] Assignee: STC plc, London, England

[21] Appl. No.: 348,256

[22] Filed: May 5, 1989

[30] Foreign Application Priority Data

May 10, 1988 [GB] United Kingdom ............... 8810972

[51] Int. Cl.$^5$ ............... H01L 29/92; H01L 29/06; H01L 29/72; H01L 27/02
[52] U.S. Cl. ..................... 357/34; 357/14; 357/20; 357/46; 357/88
[58] Field of Search ............ 357/14, 34, 13, 20, 357/46, 88

[56] References Cited

U.S. PATENT DOCUMENTS

| | | | |
|---|---|---|---|
| 3,969,750 | 7/1976 | Dhaka et al. | 357/14 |
| 4,314,267 | 2/1982 | Bergeron et al. | 357/46 |
| 4,377,029 | 3/1983 | Ozawo | 357/14 |
| 4,463,322 | 2/1984 | Scott et al. | 357/14 |
| 4,531,282 | 7/1985 | Sakai et al. | 357/34 |

FOREIGN PATENT DOCUMENTS 1172109  11/1969  United Kingdom ............... 357/14

Primary Examiner—J. Carroll
Attorney, Agent, or Firm—Lee, Mann, Smith, McWilliams & Sweeney

[57] ABSTRACT

A semiconductor structure is configurable via a customizing mask either as a varicap diode or as a polysilicon emitter bipolar transistor. The structure forms part of an integrated circuit providing e.g. a voltage controlled oscillator for a crystal frequency standard.

2 Claims, 3 Drawing Sheets

VARICAP DIODE STRUCTURE

This invention relates to varicap diode structures, e.g for use in integrated circuits, and to a method of fabricating such structures.

BACKGROUND OF THE INVENTION

A wide variety of varicap diode structures have been described. Certain of these structures have been designed or adapted for incorporation in integrated circuits. The use of such structures in semi-custom integrated circuits has however presented considerable difficulty. In a semi-custom circuit the manufacturer provides a basic circuit structure, e.g. an array of similar device blocks or cells, which is then interconnected in a particular way by one or more customer-specified masks to provide a desired circuit function. Clearly, it is to the manufacturer's advantage if he can provide a versatile basic circuit structure with a wide variety of applications so as to minimise his production costs. In such circuits, varicap diodes may be required by some customers but not by others. Thus, if conventional varicap diode structures are incorporated in a semi- custom circuit, these structures may occupy chip space that for some customers is effectively redundant. Moreover, conventional diode structures are generally fixed in maximum and minimum capacitance value prior to the application of the customising interconnections and are not amendable to modification to suit individual customer requirements.

OBJECT OF THE INVENTION

The object of the present invention is to minimise or to overcome these disadvantages.

A further object of the invention is to provide a varicap diode structure that is compatible with bipolar transistor processing.

SUMMARY OF THE INVENTION

According to the invention there is provided an integrated circuit incorporating a varicap diode structure formed in an epitaxial layer of one conductivity type on a single crystal semiconductor substrate of the other conductivity type, the structure including a surface region of the other conductivity type forming a pn junction with the epitaxial layer whereby to provide a first varicap diode, a buried layer of the one conductivity type disposed between the epitaxial layer and the substrate, said buried layer forming a pn junction with the substrate whereby to provide a second varicap diode, and a conductive region extending through the epitaxial layer to the buried region and providing electrical contact to that region.

According to the invention there is further provided an integrated circuit incorporating a varicap diode structure adjacent a polysilicon emitter bipolar transistor, the circuit including (1) a lightly doped p⁻-type semiconductor substrate having a lightly doped n⁻-type epitaxial layer disposed on a major surface thereof, (2) a heavily doped n⁺-type layer disposed between the substrate and the epitaxial layer and providing a buried layer, said buried layer forming a pn junction with the substrate whereby to provide a first varicap diode.

(3) a heavily doped n⁺-type sinker extending through the epitaxial layer to the buried layer and providing electrical contact thereto, (4) heavily doped p⁺-type regions disposed in the surface of the epitaxial layer and each forming a pin junction therewith, one said p⁺-type region providing a second varicap diode and a further said p⁺-type region forming a base contact of the bipolar transistor, (5) a shallow lightly doped p-type region disposed in the surface of the epitaxial layer and contiguous with the further p⁺-type region, said shallow p-type region providing a base of said bipolar transistor, (6) a polysilicon body disposed on said shallow p-type region and providing the emitter of said bipolar transistor, and (7) a metallisation pattern providing contact to the polysilicon emitter body, the n⁺-type sinker and said one and said further p⁺-type regions.

The portion of the circuit incorporating the varicap diode structure can be configured either as a diode or as a transistor by the use of the final customising masks.

The structure is of particular application in the construction of quartz crystal oscillator or filter packages as the arrangement can be readily configured in a voltage controlled oscillator. Also, as configuration of the diode is delayed until the final stages of circuit fabrication, a wide range of circuits can be configured using a common mask set for the earlier stages of fabrication.

BRIEF DESCRIPTION OF THE DRAWINGS

An embodiment of the invention will now be described with reference to the accompanying drawings in which.

DESCRIPTION OF PREFERRED EMBODIMENT

Figure 1:
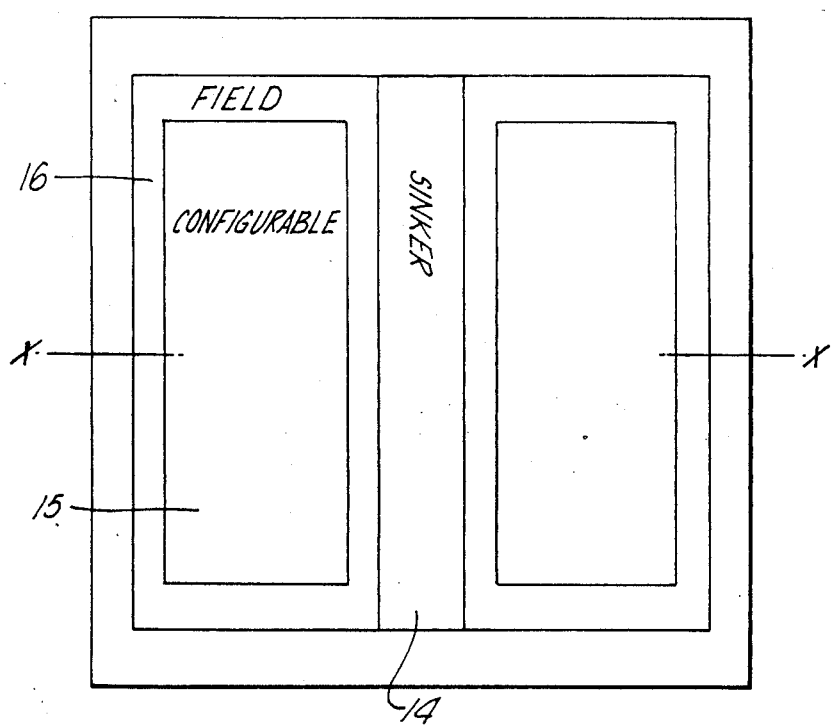
FIG. 1 is a plan view of the varicap diode structure.
Figure 3:
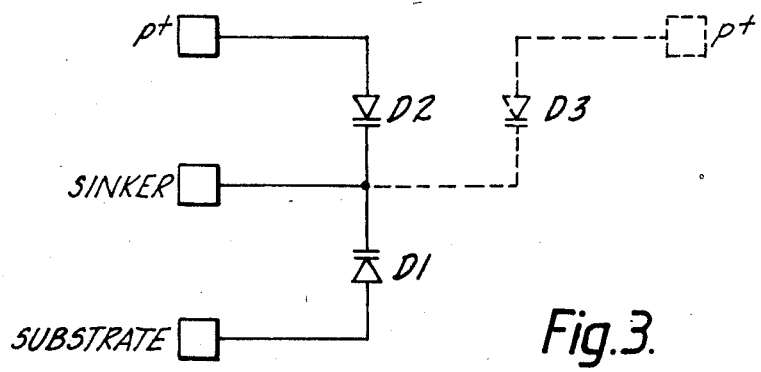
FIG. 3 shows the equivalent electrical circuit of the diode structure of FIG. 1 to 2.
Figure 2:
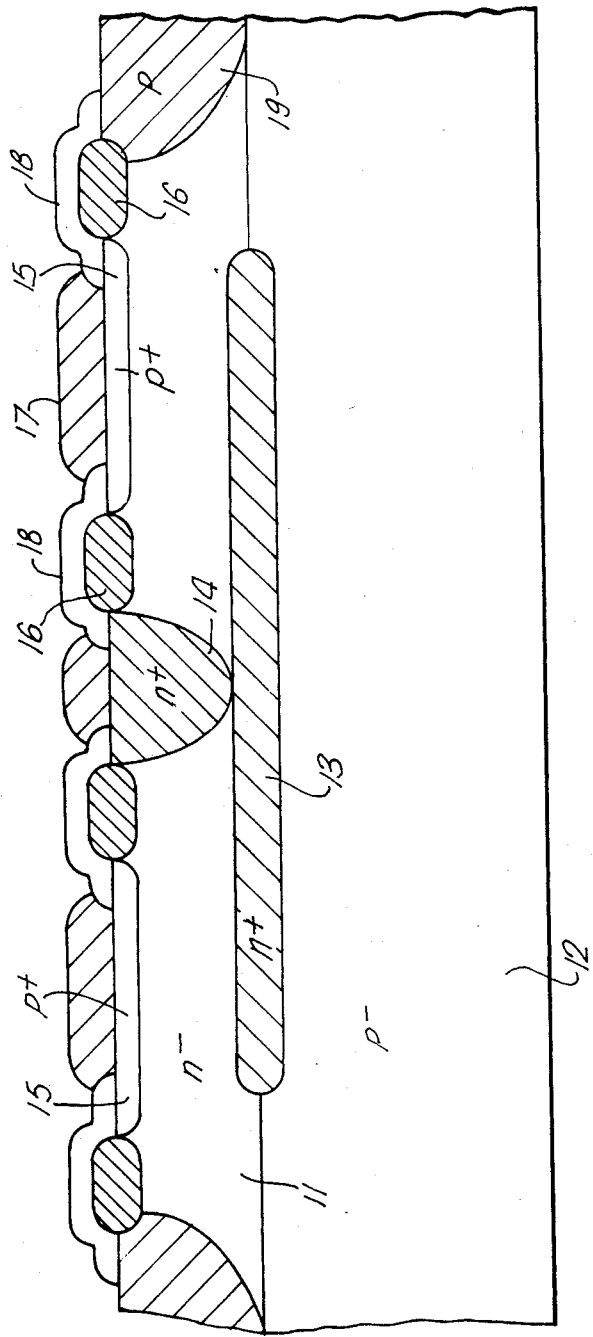
FIG. 2 is a sectional view of the diode struture of FIG. 1 taken along the lines X X.

Referring to FIGS. 1 to 3 of the drawings, the diode structure is formed in a lightly doped n⁻-type epitaxial layer 11 disposed on a lightly doped p⁻-type semiconductor, e.g. silicon substrate 12. A heavily doped n⁺-type buried layer 13 is disposed between the epitaxial layer 11 and the substrate 12, and is contacted via a heavily doped n⁺-type sinker 14 (FIG. 2) extending through the epitaxial layer 11. Heavily doped p⁺-type regions 15 are formed, e.g. by implantation, in the surface of the epitaxial layer 11 adjacent the sinker 14 and are isolated therefrom by field oxide 16. This field oxide 16 surrounds the p⁺-type regions 15. Electrical contact to the P⁺-type regions 15 and to the sinker 14 is effected via metallisation 17 deposited over a patterned glass passivation layer 18. The structure is isolated from adjacent devices by p-type isolation regions 19.

The pn junctions formed between the p⁺-type regions 15 and the epitaxial layer 11 and between the buried layer 13 and the substrate 12 are both abrupt and of significant area so as to provide a significant junction capacitance. Each junction provides a varicap diode whose capacitance range is determined by junction area and by the abruptness of the junction.

The areas of the pn junctions between the p⁺-type regions and the epitaxial may be so defined, by determinations of the dimensions of these regions, so as to achieve a particular value for each varicap diode. This may be effected by the use of a customer defined mark whereby a polycrystalline silicon (polysilicon) pattern is applied to the structure prior to implantation of the $p^+$-type regions. This pattern then provides an implantation mask for the $p^+$-type regions. In some applications, one $p^+$-type region of the structure of FIGS. 1 to 3 may be masked out completely to provide a structure having only two diodes. The polysilicon layer may also provide series resistors for the diodes.

FIG. 3 shows the equivalent electrical circuit of the diode structure of FIGS. 1 and 2. Diode D1 is provided by the buried layer 13 whilst diodes D2 and D3 are provided by the $p^+$-type regions.

Figure 4:
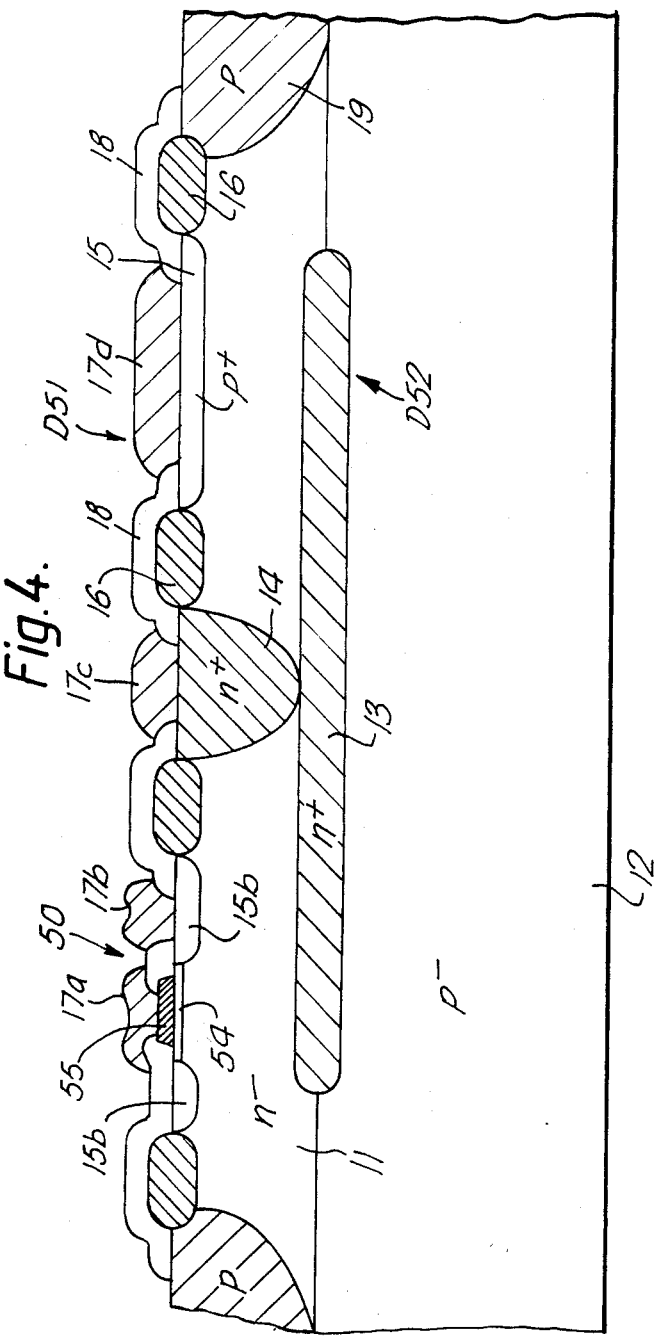
FIG. 4 shows the structure of FIGS. 1 to 3 in an alternative bipolar transistor configuration.

FIG. 4 illustrates the manner in which the diode structure of FIGS. 1 to 3 may be incorporated in a bipolar polysilicon emitter process. In some applications this process may also include the formation of field effect transistors.

Referring to FIG. 4, there is shown a structure which includes a polysilicon emitter transistor, generally indicated by the reference numeral 50, and two varicap diodes (D51, D52). In this arrangement the $p^+$-type region 15a provides the cathode of the varicap diode D51. The other $P^+$-type region 15b is divided into two portions one of which provides the base contact of a bipolar transistor 50. Between the two portions of the region 15b a shallow lightly doped p-type implant 54 is provided. Above this implant there is a polysilicon emitter body 55 contacted by a metal layer 17a. Further parts of this metal layer (17b) provide contacts to the transistor base, (17c) to the sinker 14, and (17d) to the cathode 15 of diode D51. The n-type epitaxial layer provides the collector of the transistor and is contacted via the buried layer 13 and the sinker 14. It will be appreciated configuration of each $p^+$-type region 15 to form either the cathode of a varicap diode or the base contact of a bipolar transistor is effected at a late stage of the process, i.e. at a customising stage. The circuit manufacturer can thus provide a single basic circuit structure that is adapted by each customer to his particular requirements.

A particular application of the technique described herein is in the fabrication of a crystal oscillator or filter package comprising one or more piezo-electric frequency detaining crystals mounted on an integrated circuit incorporating the varicap diode structure and comprising voltage controlled oscillator.

I claim:

1. An integrated circuit incorporating a varicap diode structure adjacent a polysilicon emitter bipolar transistor in a common device region, the circuit including:
   (1) a lightly doped $p^-$-type semiconductor substrate having a lightly doped $n^-$-type epitaxial layer disposed on a major surface thereof,
   (2) a heavily doped $n^+$-type layer disposed between the substrate and the epitaxial layer and providing a buried layer, said buried layer forming a pn junction with the substrate whereby to provide a first varicap diode.
   (3) a heavily doped $n^+$-type sinker extending through the epitaxial layer to the buried layer and providing electrical contact to a central region thereof,
   (4) heavily doped $p^+$-type regions disposed in the surface of the epitaxial layer and each forming a pn junction therewith, one said $p^{30}$-type region providing a second varicap diode and a further said $p^+$-type region forming a base contact of the bipolar transistor, said $p^+$-type regions having been formed simultaneously via a polysilicon mask,
   (5) a shallow lightly doped p-type region disposed in the surface of the epitaxial layer and contiguous with the further $p^+$-type region, said shallow p-type region providing a base of said bipolar transistor,
   (6) a polysilicon body disposed on said shallow p-type region and providing the emitter of said bipolar transistor said polysilicon body comprising part of said polysilicon mask, and
   (7) a metallisation pattern providing contact to the polysilicon emitter body, the $n^+$-type sinker and said one and said further $p^+$-type regions.

2. An integrated circuit as claimed in claim 1, and incorporating a plurality of device regions, some of which accommodate a pair of varicap diodes.

* * * * *